US012336104B2

(12) United States Patent
Lai et al.

(10) Patent No.: US 12,336,104 B2
(45) Date of Patent: Jun. 17, 2025

(54) PHOTOSENSITIVE ASSEMBLY HAVING A BENT SHAPE AND METHOD FOR MANUFACTURING THE SAME, AND CAMERA MODULE HAVING THE SAME

(71) Applicant: TRIPLE WIN TECHNOLOGY(SHENZHEN) CO. LTD., Shenzhen (CN)

(72) Inventors: Wen-Ching Lai, New Taipei (TW); Wan-Li Zhang, Jincheng (CN); Zhi-Wei Li, Jincheng (CN); Ya-Jie Niu, JinCheng (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 277 days.

(21) Appl. No.: 17/992,595

(22) Filed: Nov. 22, 2022

(65) Prior Publication Data
US 2024/0074063 A1    Feb. 29, 2024

(30) Foreign Application Priority Data
Aug. 31, 2022    (CN) .................. 202211054179.X

(51) Int. Cl.
*H05K 1/18*    (2006.01)
*H05K 1/02*    (2006.01)
*H10F 39/00*    (2025.01)

(52) U.S. Cl.
CPC ............ *H05K 1/189* (2013.01); *H05K 1/0281* (2013.01); *H10F 39/806* (2025.01); *H05K 2201/10121* (2013.01)

(58) Field of Classification Search
CPC ......... H04N 23/57; H05K 2201/10121; H05K 1/189; H05K 1/0281; H10F 39/806
See application file for complete search history.

(56) References Cited

U.S. PATENT DOCUMENTS 6,791,072 B1 * 9/2004 Prabhu .................... H10F 39/80 257/E31.117
7,923,793 B2 * 4/2011 Choi ................. H01L 27/14683 257/415
9,985,059 B2 * 5/2018 Shin .................. H01L 27/14605

FOREIGN PATENT DOCUMENTS

TW    201913214 A    4/2019

* cited by examiner

Primary Examiner — James Wu
(74) Attorney, Agent, or Firm — ScienBiziP, P.C.

(57) ABSTRACT

A photosensitive assembly includes a circuit board and a photosensitive chip disposed on the circuit board. A first direction is defined as a direction from the circuit board to the photosensitive chip. The circuit board is convex in the first direction or an opposite direction of the first direction. The photosensitive chip is in the first direction or the opposite direction of the first direction. A bending direction of the circuit board is the same as a bending direction of the photosensitive chip.

4 Claims, 9 Drawing Sheets

PHOTOSENSITIVE ASSEMBLY HAVING A BENT SHAPE AND METHOD FOR MANUFACTURING THE SAME, AND CAMERA MODULE HAVING THE SAME

FIELD

The subject matter relates to imaging devices, and more particularly, to a photosensitive assembly and a method for manufacturing the photosensitive assembly, and a camera module having the photosensitive assembly.

BACKGROUND

A camera module may include at least one lens and a photosensitive chip. When light from a planar object enters the lens and focuses on the photosensitive chip, an image surface of the plane object may be curved due to a field curvature of the lens. The curved image surface does not coincide with an ideal image plane of the planar object, which may result in uneven image quality of the camera module and reduce the image quality.

To reduce the influence of field curvature on the image quality, the number of the lenses of the camera module needs to be increased. However, even with an increase of the number of the lenses, effects of the field curvature cannot be completely eliminated. However, increasing the number of lenses will increase the weight and the size of the camera module. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
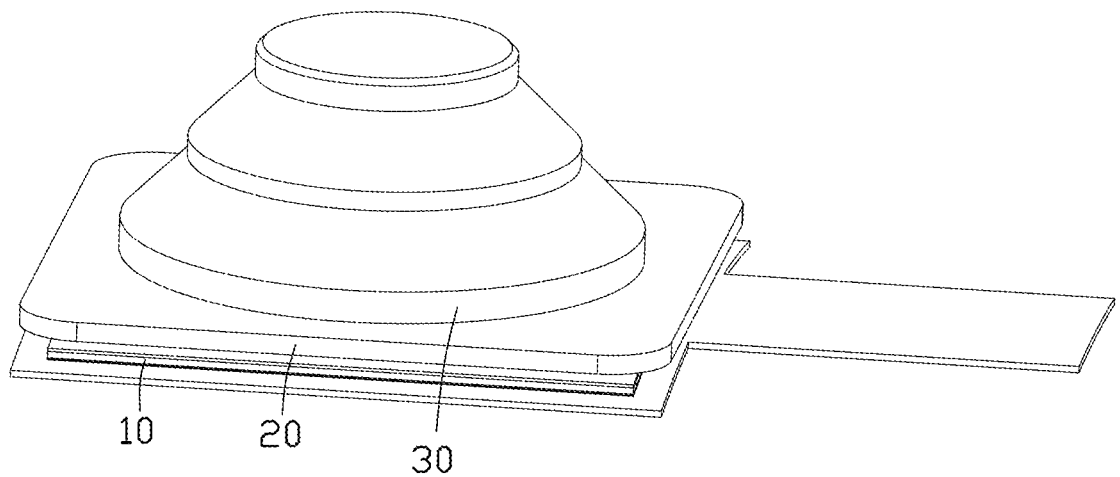
FIG. 1 is a diagrammatic view of a camera module according to an embodiment of the present disclosure.

It will be appreciated that for simplicity and clarity of illustration, where appropriate, reference numerals have been repeated among the different figures to indicate corresponding or analogous components. In addition, numerous specific details are set forth in order to provide a thorough understanding of the embodiments described herein. How- ever, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
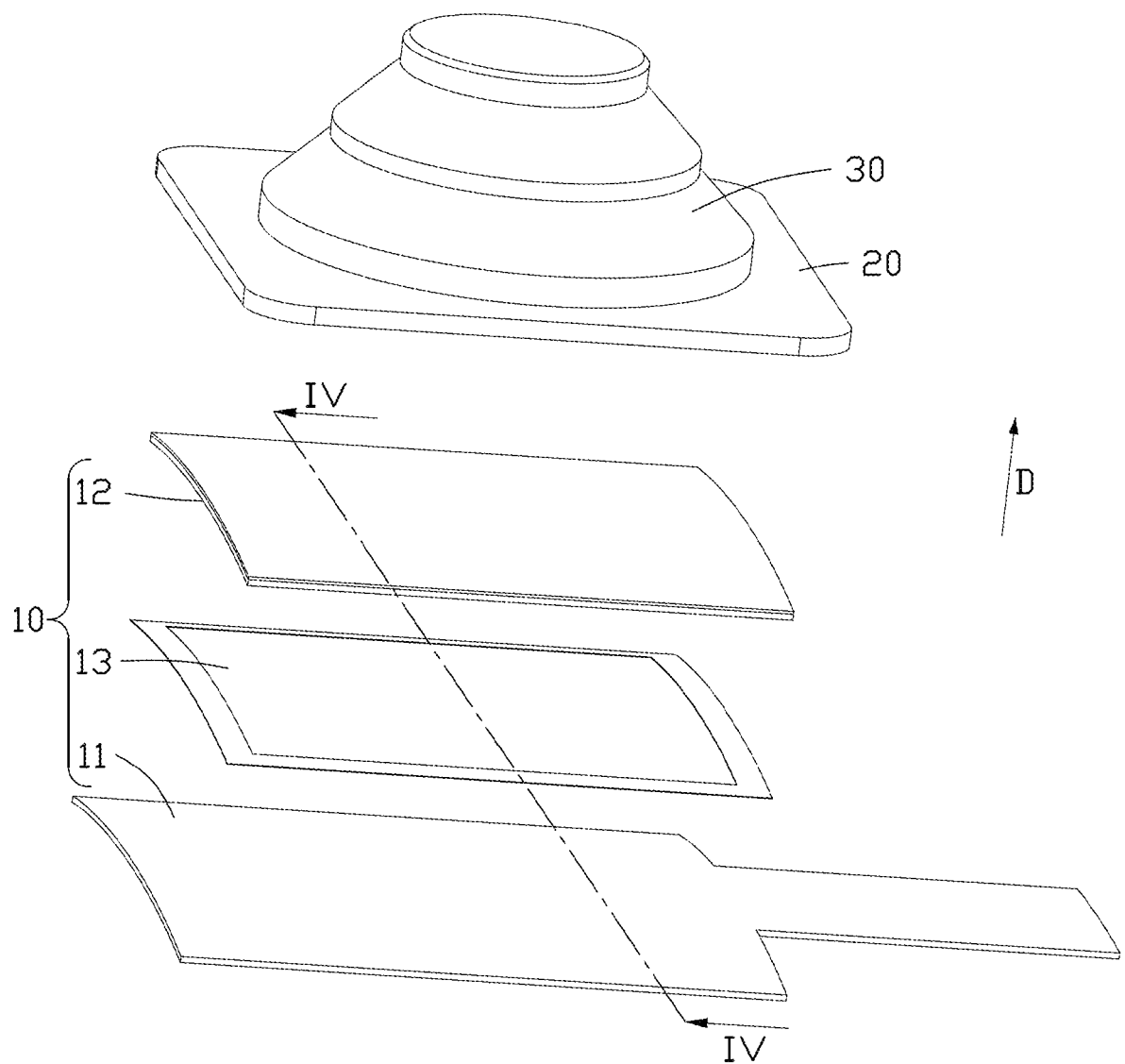
FIG. 2 is an exploded view of the camera module of FIG. 1.

Referring to FIGS. 1 and 2, a camera module 100 is provided according to an embodiment of the present disclosure. The camera module 100 includes a photosensitive assembly 10, a lens base 20 and a lens 30. The photosensitive assembly 10 includes a circuit board 11 and a photosensitive chip 12 disposed on and electrically connected to the circuit board 11. In the embodiment, the photosensitive chip 12 may be a Complementary Metal Oxide Semiconductor (CMOS) sensor or a Charge Coupled Device (CCD) sensor. The lens base 20 is disposed on the photosensitive chip 12. The lens 30 is disposed on the lens base 20 and faces the photosensitive chip 12. Light passes through and is focused by the lens 30 to form an imaging surface S1 or S2 (shown in FIGS. 3 and 4) in front of the photosensitive chip 12. The imaging surface S1 or S2 is bent. A direction from the circuit board 11 to the photosensitive chip 12 is defined as a first direction D. The imaging surface S1 or S2 is convex in the first direction D or in an opposite direction of the first direction D.

Figure 3:
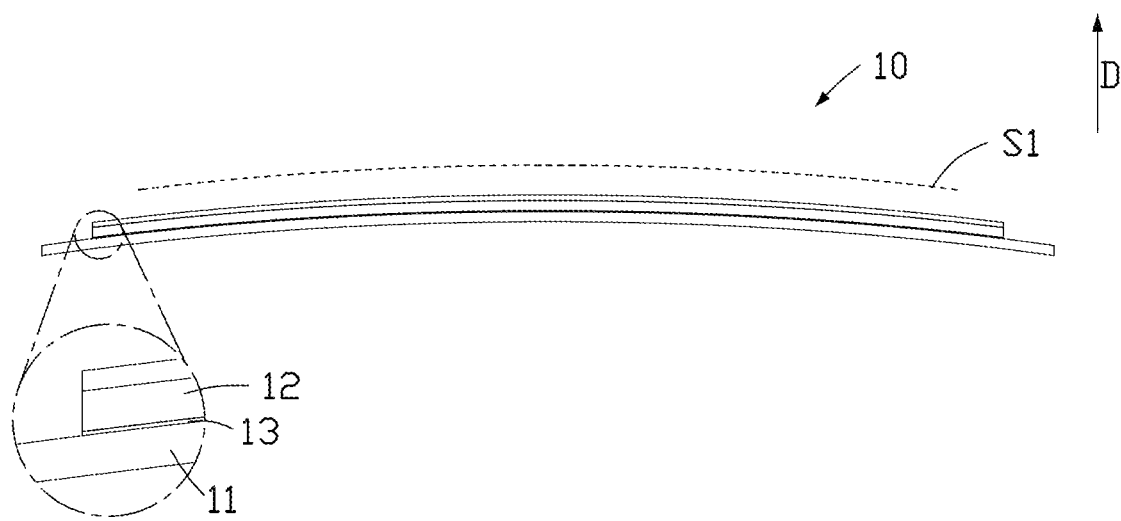
FIG. 3 is a diagrammatic view of a photosensitive assembly of the camera module of FIG. 1.
Figure 4:
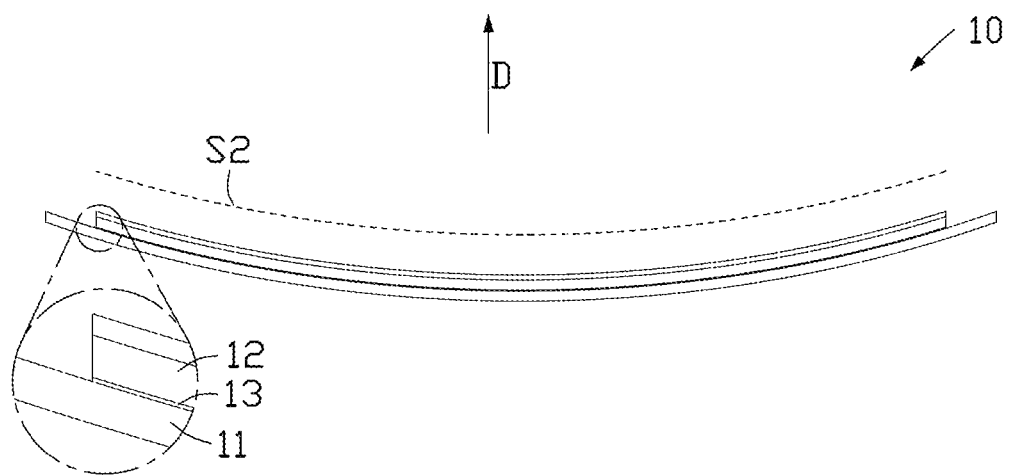
FIG. 4 is a diagrammatic view of a photosensitive assembly according to another embodiment of the present disclosure.

Referring to FIGS. 3 and 4, the photosensitive assembly 10 is also bent. The photosensitive assembly 10 is convex in the first direction D or in the opposite direction of the first direction D. Each of the circuit board 11 and the photosensitive chip 12 is also convex in the first direction D or in the opposite direction of the first direction D. The bent direction of the circuit board 11 is the same as that of the photoreceptor chip 12. In other words, the circuit board 11 includes a convex surface defining a focus point. The photosensitive chip 12 includes a convex surface defining a focus point. The focusing point of the circuit board 11 is on a same side as the focus point of the photosensitive chip 12.

During an imaging process, when the light passing through the lens 30 forms the imaging surface S1 convex in the first direction, the photoreceptor assembly 10 is also convex in the first direction D. When the light passing through the lens 30 forms the imaging surface S2 convex in the opposite direction of the first direction D, the photoreceptor assembly 10 is also convex in the opposite direction of the first direction D. The shape of the photosensitive assembly 10 can be adjusted according to the field curvature of the camera module 100.

Therefore, the bent direction of the photosensitive assembly 10 matches the imaging surface S1 or S2. Thus, the influence of field curvature on imaging can be reduced, and the image uniformity can be improved. Compared with increasing the number of lenses to reduce the influence of field curvature, the present disclosure reduces the weight and size of camera module 100 and the production cost. In addition, the photosensitive assembly 10 can be used in the camera module 100 that does not need to optimize the field curvature at an initial design stage, the photosensitive assembly 10 has universality. Furthermore, the photosensitive chip 12 and the circuit board 11 are bent in the same direction, so that the circuit board 11 further strengthens the photosensitive chip 12 to reduce the resilience of the photosensitive chip 12.

In at least one embodiment, a first adhesive layer 13 is arranged between the photosensitive chip 12 and the circuit board 11. The first adhesive layer 13 bonds the photosensitive chip 12 to the circuit board 11.

Figure 5:
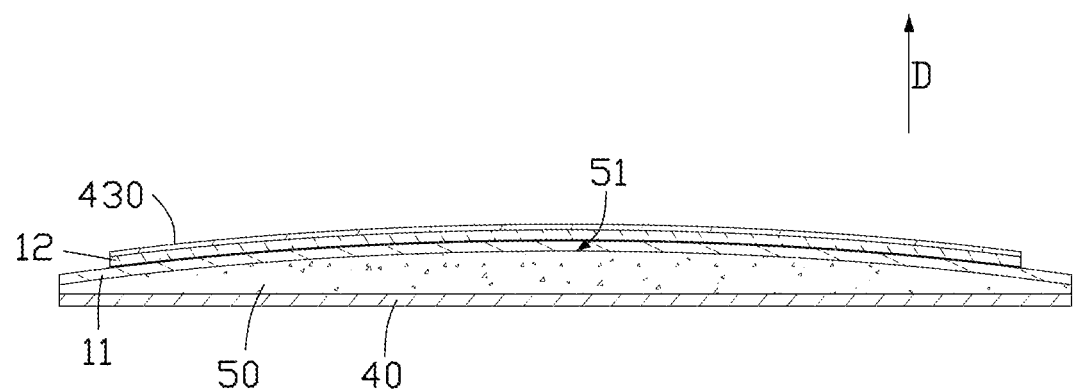
FIG. 5 is a diagrammatic view of the photosensitive assembly and a reinforcing plate of the camera module of FIG. 1.

Referring to FIG. 5, in at least one embodiment, the camera module 100 also includes a reinforcing plate 40, which is mounted on a surface of the circuit board 11 away from the photosensitive chip 12. The reinforcing plate 40 improves a strength of the circuit board 11. The reinforcing plate 40 is a flat plate. By mounting the reinforcing plate 40 being flat to the photosensitive chip 12, the camera module 100 can match other components in the electronic device 200 without the need to change the structure of other components. Thus, the universality of the camera module 100 is improved.

In at least one embodiment, a second adhesive layer 50 is arranged between the reinforcing plate 40 and the circuit board 11. The second adhesive layer 50 fills in a gap between the curved circuit board 11 and the reinforcing plate 40. The second adhesive layer 50 includes a contact surface 51, which is convex in the first direction D. Thus, the contact surface 51 is closely bonded with the circuit board 11. The second adhesive layer 50 not only bonds the reinforcing plate 40 to the circuit board 11, but also limits the bent degree of the circuit board 11. Thus, the second adhesive layer 50 can prevent the circuit board 11 from rebounding during future use.

Figure 8:
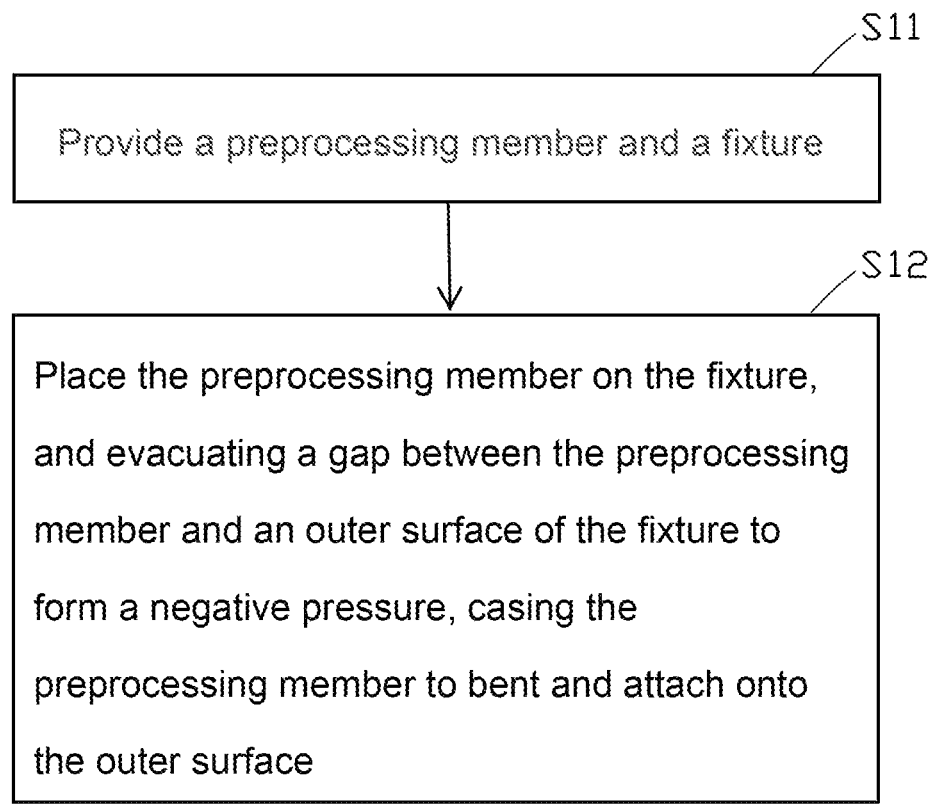
FIG. 8 is a flowchart of a method for manufacturing a photosensitive assembly according to an embodiment of the present disclosure.

Referring to FIG. 8, a method for manufacturing photosensitive assembly 10 is also presented in accordance with an embodiment. The method is provided by way of example, as there are a variety of ways to carry out the method. The method can begin at step S1.

Figure 6:
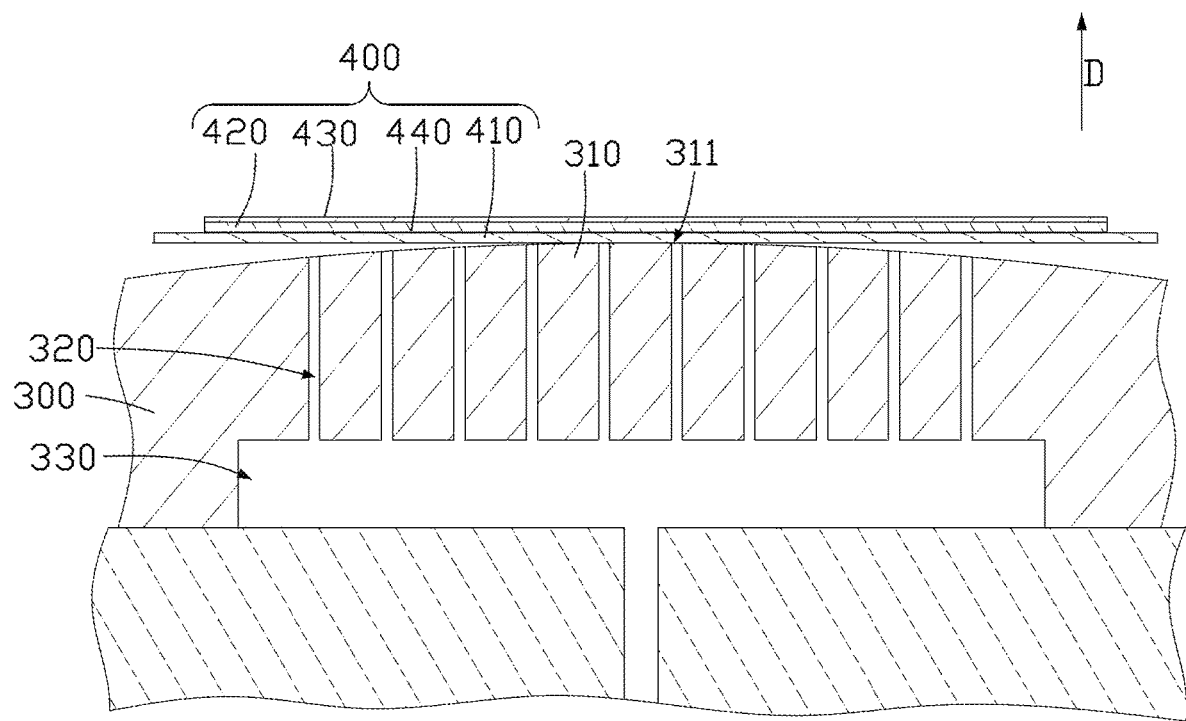
FIG. 6 is a diagrammatic view of a fixture and a preprocessing member according to an embodiment of the present disclosure.

S11, referring to FIG. 6, a preprocessing member 400 and a fixture 300 are provided.

The preprocessing member 400 includes a preprocessing circuit board 410 and a preprocessing photosensitive chip 420 disposed on the preprocessing circuit board 410. The preprocessing member 400 is flat.

The fixture 300 includes an end portion 310. The end portion 310 includes an outer surface 311 that is a convex surface. The outer surface 311 may be convex in the first direction D or in the opposite direction of the first direction D. The outer surface 311 defines a focus point. The outer surface 311 further defines a number of air passages 320 that are communicating with an external air source (not shown). In at least one embodiment, the fixture 300 also includes a vacuum chamber 330 communicating with the air passages 320. The vacuum chamber 330 is connected to the external air source.

In at least one embodiment, a release film 430 is disposed on a side of the preprocessing photosensitive chip 420 away from the preprocessing circuit board 410. The release film 430 protects the preprocessing photosensitive chip 420 and avoids damages to the surface of the preprocessing photosensitive chip 420 during a subsequent processing process.

Adhesive may also be injected in a gap between the preprocessing circuit board 410 and the preprocessing photosensitive chip 420. After curing, a preprocessing adhesive layer 440 is formed, which bonds the preprocessing circuit board 410 to the preprocessing photosensitive chip 420.

Figure 7:
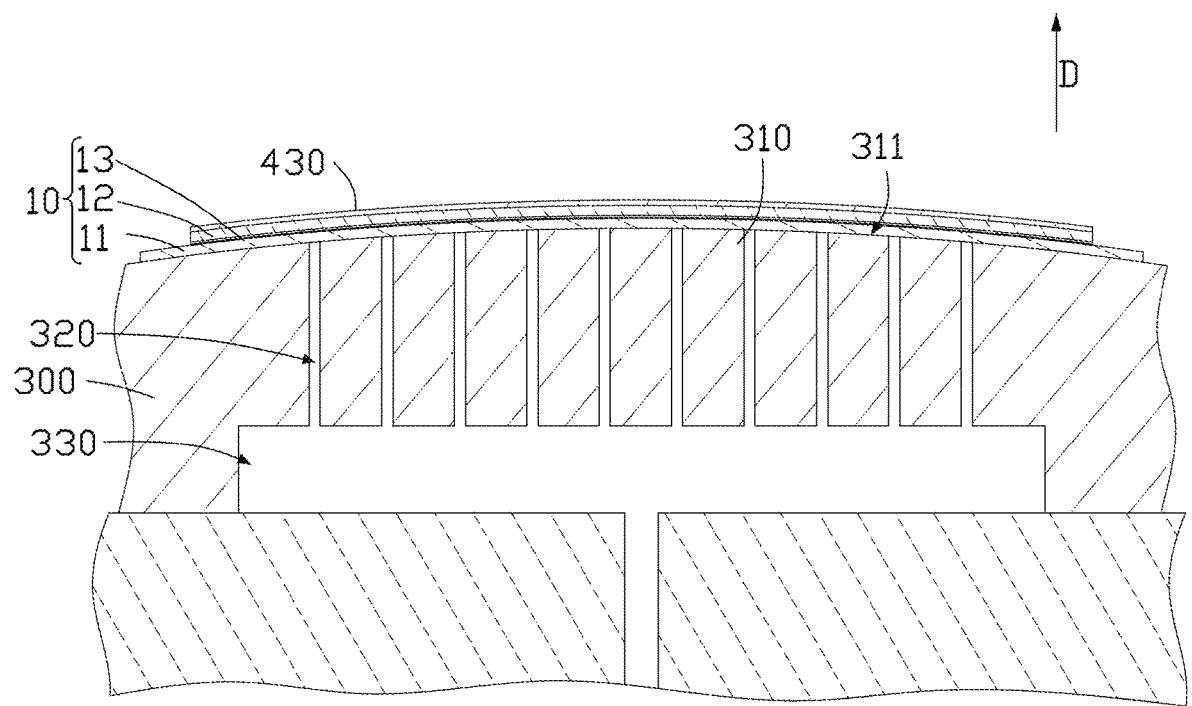
FIG. 7 is a diagrammatic view showing processes of deforming a member to obtain the photosensitive assembly of FIG. 3.

S12, referring to FIG. 7, the preprocessing member 400 is placed on the end portion 310, so that the focus point is either in front of the preprocessing photosensitive chip 420 or the preprocessing circuit board 410. Since the preprocessing member 400 is flat, a gap is generated between the preprocessing member 400 and the outer surface 311 of the end portion 310. Then, the gap between the preprocessing member 400 and the outer surface 311 is evacuated to generate a vacuum pressure in the gap. Thus, the preprocessing circuit board 410 and the preprocessing photosensitive chip 420 are deformed and attached onto the outer surface 311 under the vacuum pressure, to form the circuit board 11 and the photosensitive chip 12, respectively. Then, the bent photosensitive assembly 10 is obtained.

In this step, the preprocessing adhesive layer 440 is formed to form the first adhesive layer 13.

In at least one embodiment, the air passages 320 are spaced apart from each other on the outer surface 311. Each two adjacent air passages 320 are spaced apart from each other by a same distance. Thus, the pressure applied on different areas of the preprocessing member 400 are even, which improves the evenness of bending and avoids the unpredictable deformation of the photosensitive assembly 10.

In at least one embodiment, the preprocessing circuit board 410 is a soft (flexible) circuit board, which is convenient for bending the preprocessing circuit board 410 under the negative pressure.

In at least one embodiment, after the preprocessing member 400 is attached to the outer surface 311, a time period of maintaining the negative pressure is between 30 seconds and 2 minutes. Thus, the bent photosensitive assembly 10 remains on the outer surface 311 for a certain period, which prevents the photosensitive assembly 10 from rebounding in future use.

In the present disclosure, the preprocessing member 400 is bent under the negative pressure, which reduces damages to the photosensitive assembly 10. Furthermore, at the initial stage of assembly, the bent degree of the photosensitive chip 12 can be set according to the field curvature of the imaging surface of the lens 30. Thus, the photosensitive chip 12 can match the field curvature of the lens 30, thereby avoids the influence of the field curvature on the imaging surface of the photosensitive chip 12. The present disclosure does not need to increase the number of lenses in the camera module 100, which can simplify the assembly process and reduce the weight and size of the camera module 100.

Figure 9:
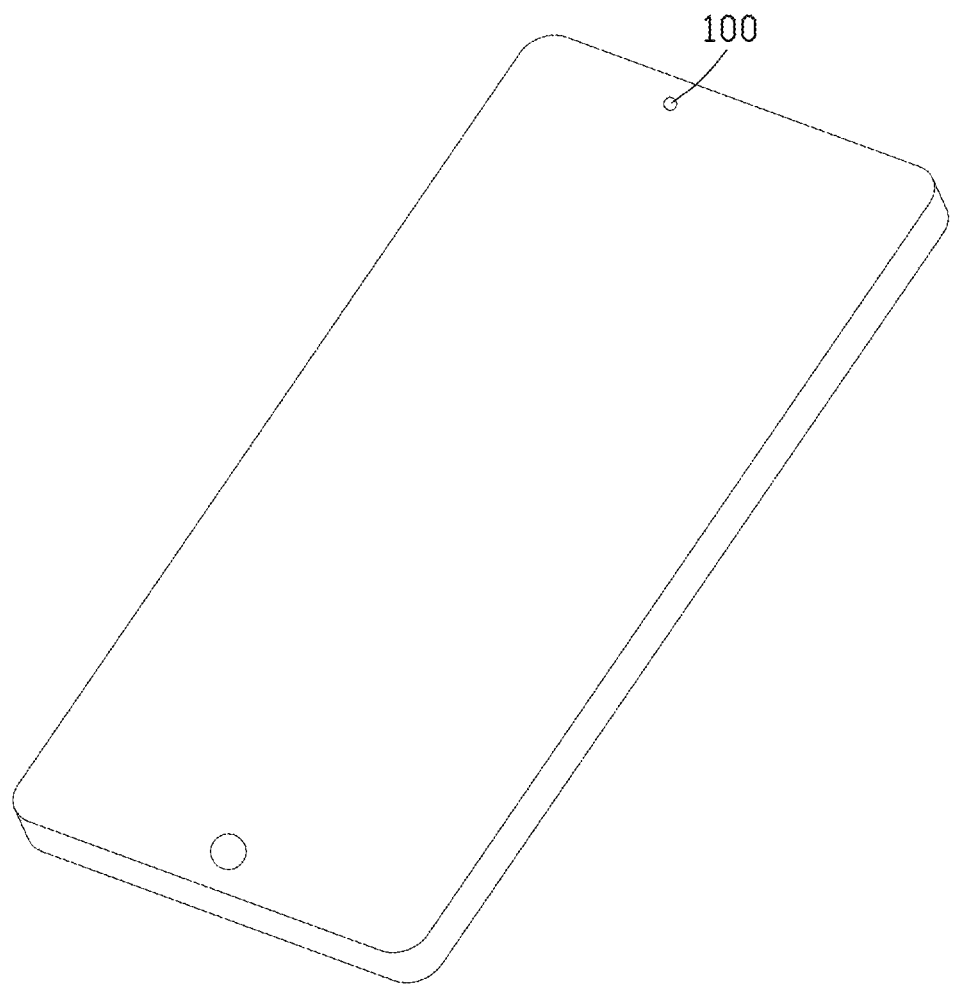
FIG. 9 is a diagrammatic view of an electronic device according to an embodiment of the present disclosure.

Referring to FIG. 9, an electronic device 200 is also provided according to an embodiment of the present disclosure. The electronic device 200 may be a mobile phone, a tablet computer, a laptop, a video phone, a digital camera, etc. In at least one embodiment, the electronic device 200 is a mobile phone.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A camera module, comprising:
   a lens base;
   a lens mounted on the lens base; and
   a photosensitive assembly comprising a circuit board and
      a photosensitive chip disposed on the circuit board, the
      lens base is disposed on the photosensitive chip;
   wherein the circuit board comprises a convex surface
      defining a focus point, the photosensitive chip comprises a convex surface defining a focus point, the convex surface of the circuit board is convex toward the lens base, the convex surface of the photosensitive chip is convex toward the lens base, and the focusing point of the circuit board is on a same side as the focus point of the photosensitive chip.

2. The camera module according to claim 1, further comprising a reinforcing plate disposed on a surface of the circuit board, wherein the reinforcing plate is entirely flat, a surface of the reinforcing plate facing the circuit board is flat, and the circuit board is sandwiched between the reinforcing plate and the photosensitive chip.

3. The camera module according to claim 2, further comprising a second adhesive layer disposed between the circuit board and the reinforcing plate, wherein the second adhesive layer comprises a contact surface bonded to the circuit board, and the contact surface is convex toward the circuit board.

4. The camera module according to claim 1, wherein the circuit board is a flexible circuit board.

\* \* \* \* \*